United States Patent
Callegari et al.

(10) Patent No.: US 7,569,466 B2
(45) Date of Patent: Aug. 4, 2009

(54) DUAL METAL GATE SELF-ALIGNED INTEGRATION

(75) Inventors: Alessandro C. Callegari, Yorktown Heights, NY (US); Michael P. Chudzik, Danbury, CT (US); Bruce B. Doris, Brewster, NY (US); Vijay Narayanan, New York, NY (US); Vamsi K. Paruchuri, New York, NY (US); Michelle L. Steen, Danbury, CT (US)

(73) Assignee: International Business Machines Corporation, Armonk, NY (US)

( * ) Notice: Subject to any disclaimer, the term of this patent is extended or adjusted under 35 U.S.C. 154(b) by 273 days.

(21) Appl. No.: 11/303,715

(22) Filed: Dec. 16, 2005

(65) Prior Publication Data

US 2007/0138563 A1    Jun. 21, 2007

(51) Int. Cl.
*H01L 21/3205* (2006.01)
*H01L 21/4763* (2006.01)

(52) U.S. Cl. ............... 438/592; 257/392; 257/391; 257/369; 257/E21.637

(58) Field of Classification Search .............. 438/229, 438/157, 199, 218, 216, 227, 621, 622, 592; 257/369, E21.637, 391, 392
See application file for complete search history.

(56) References Cited

U.S. PATENT DOCUMENTS

| 2004/0256700 | A1  | 12/2004 | Doris et al. |
| 2005/0093104 | A1  | 5/2005  | Ieong et al. |
| 2005/0116290 | A1  | 6/2005  | de Souza et al. |
| 2006/0172516 | A1* | 8/2006  | Adetutu et al. ............ 438/517 |
| 2007/0048920 | A1* | 3/2007  | Song et al. ................ 438/199 |

OTHER PUBLICATIONS

Yu et al., "Direct nitridation of high-k metal oxide thin films using argon excimer sources", Electronics Letters, Oct. 27, 2005, vol. 41, No. 22, pp. 1210-1211.*

* cited by examiner

*Primary Examiner*—W. David Coleman
*Assistant Examiner*—Sonya D McCall-Shepard
(74) *Attorney, Agent, or Firm*—Scully, Scott, Murphy & Presser, P.C.; Louis J. Percello, Esq.

(57) ABSTRACT

A semiconductor structure including at least one n-type field effect transistor (nFET) and at least one p-type field effect transistor (pFET) that both include a metal gate having nFET behavior and pFET behavior, respectively, without including an upper polysilicon gate electrode is provided. The present invention also provides a method of fabricating such a semiconductor structure.

10 Claims, 5 Drawing Sheets

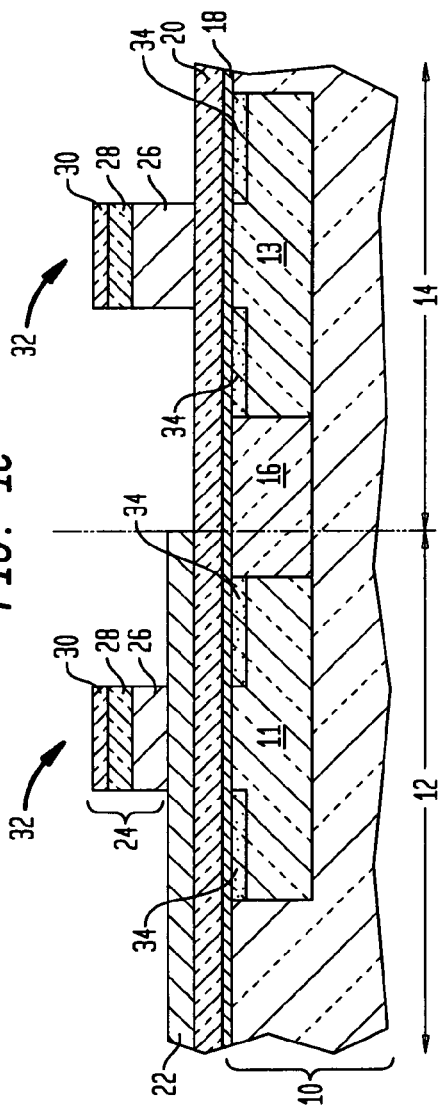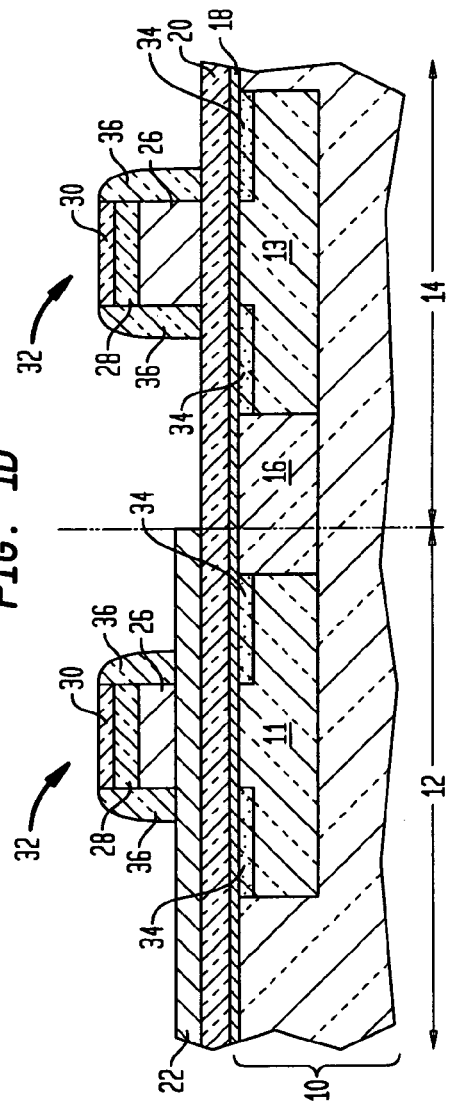

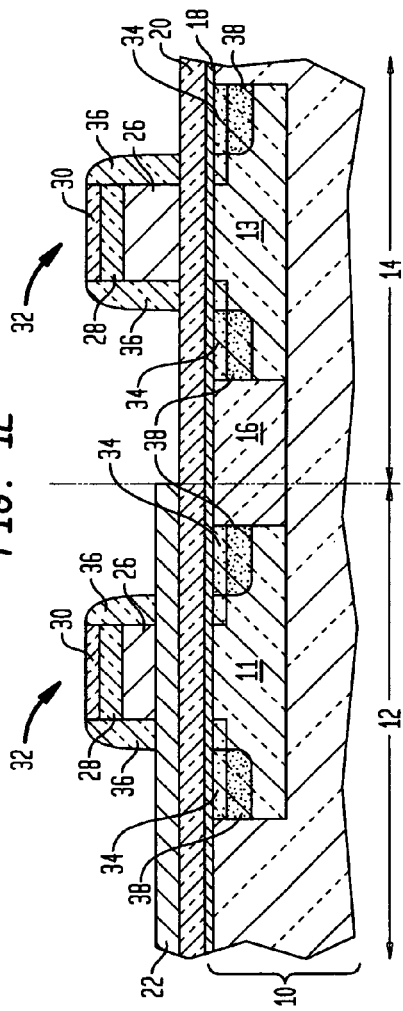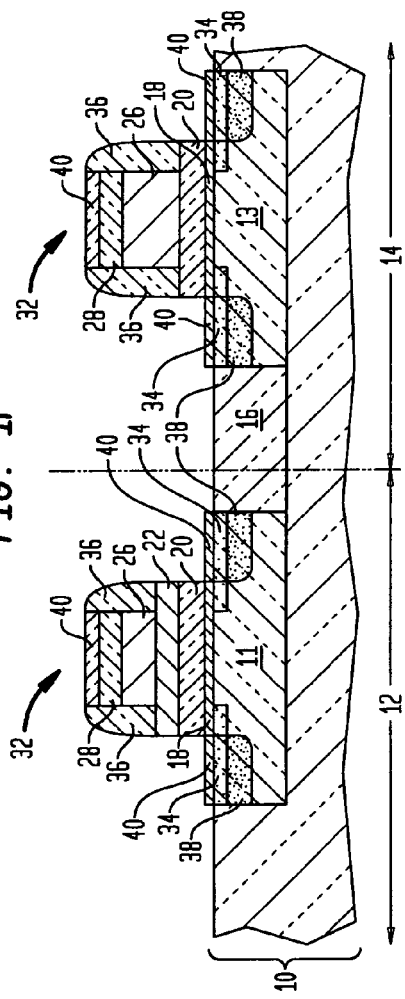

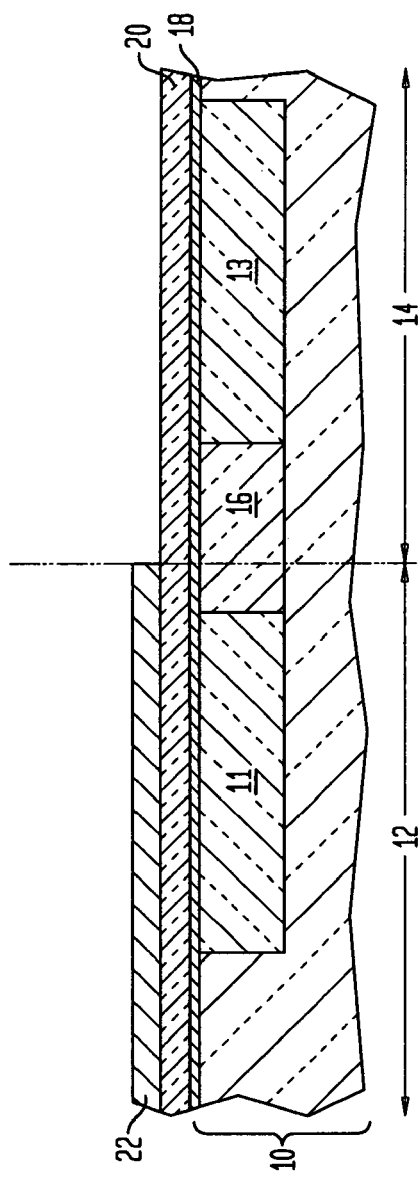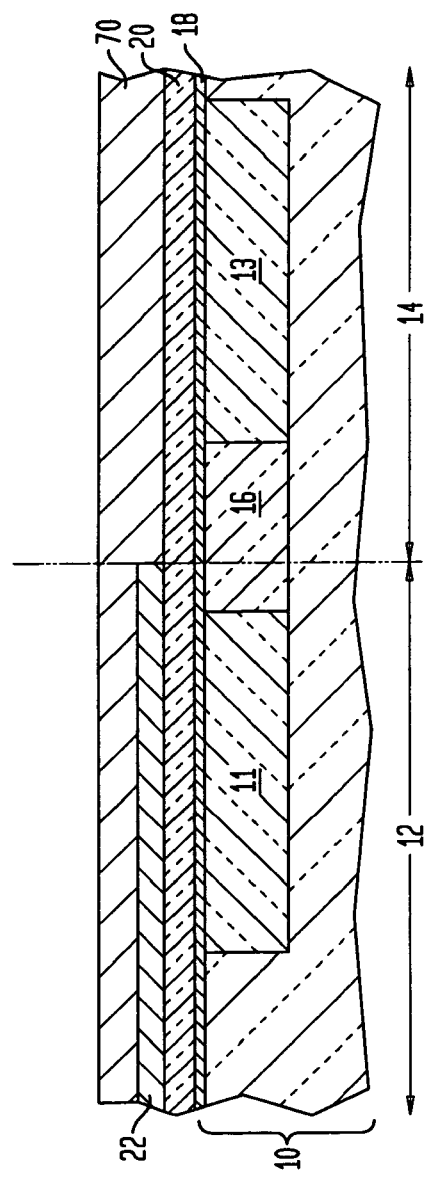

DUAL METAL GATE SELF-ALIGNED INTEGRATION

FIELD OF THE INVENTION

The present invention relates to a semiconductor structure, and more particularly to a semiconductor structure including at least one n-type field effect transistor (nFET) and at least one p-type field effect transistor (pFET) that both include a metal gate, without including an upper polysilicon gate electrode. The present invention also provides a method of fabricating such a semiconductor structure.

BACKGROUND OF THE INVENTION

In standard complementary metal oxide semiconductor (CMOS) devices, polysilicon is typically the standard gate material. The technology of fabricating CMOS devices using polysilicon gates has been in a constant state of development, and is now widely used in the semiconductor industry. One advantage of using polysilicon gates is that they can sustain high temperatures. However, there are also some problems associated with using a polysilicon gate. For example, due to the poly-depletion effect and relative high electrical sheet resistance, polysilicon gates commonly used in CMOS devices are becoming a gating factor in chip performance for channel lengths of 0.1 micron and below. Another problem with polysilicon gates is that the dopant in the polysilicon gate, such as boron, can easily diffuse through the thin gate dielectric causing further degradation of the device performance.

Another problem with polysilicon gates which include a dielectric material having a dielectric constant that is greater than that of silicon dioxide is that during inversion the polysilicon gate undergoes a threshold voltage or flatband shift that shifts those values from ideal values to non-ideal values.

In order to avoid the problems with polysilicon gates, it has been suggested to form a single metal beneath the polysilicon gate. That is, in current processing a thin metal layer for both the pFET and the nFET device is formed beneath a polysilicon gate electrode. During device processing, which includes thermal techniques above 1000° C., polysilicon appears to interact with the thin metal changing the workfunction and therefore the threshold voltages of the devices. In particular, hydrogen from the silane as well as silicon may diffuse into the metal layer forming hydrides or silicides which have a mid-gap workfunction. For example, during high temperature annealing, a polysilicon/metal gate stack becomes mid-gap rather than a solution for a pFET or an nFET.

In view of the above, there is a continued need for providing a semiconductor structure in which the nFETs are engineered to include a metal gate which maintains n-type behavior, while the pFETs are engineered to include a metal gate which maintains p-type behavior.

SUMMARY OF THE INVENTION

A semiconductor structure including at least one n-type field effect transistor (nFET) and at least one p-type field effect transistor (pFET) that both include a metal gate, without including an upper polysilicon gate electrode is provided. More particularly, the present invention provides a semiconductor structure in which the nFETs are engineered to include a metal gate hich maintains n-type behavior (i.e., an n-type workfunction), while the pFETs are engineered to include a metal gate which maintains p-type behavior (i.e., a p-type workfunction).

In one embodiment of the present invention, the above is achieved by providing a single metal layer, without an overlying Si-containing gate electrode, as the gate in both the nFET device and the pFET device. In order to maintain nFET behavior, a rare earth metal (or rare earth-like metal)-containing layer is present below the single metal layer in the nFET device region. In both device regions, a dielectric material having a dielectric constant of greater than that of silicon dioxide is present beneath the single metal gate.

In another embodiment of the present invention, the above is achieved by forming a patterned gate region including a metal nitride layer within both device regions. The patterned gate region within the pFET device region is then selectively oxidized forming a $M'O_aN_b$ layer in the pFET device region. In the latter formula, M' is a metal from Group IVB, VB, VIB or VIIB of the Periodic Table of Elements, a is from about 5 to about 40 atomic percent and b is from about 5 to about 40 atomic percent.

In general terms, the present invention provides a semiconductor structure that comprises:

a semiconductor substrate comprising at least one nFET device region and at least one pFET device region, which are separated by an isolation region;

a first metal gate stack within said at least one nFET device region, said first metal gate stack having nFET behavior and comprising a rare earth metal-containing layer and a first metal layer; and a second metal gate stack within said at least one pFET device region, said second metal gate stack having pFET behavior and comprising a second metal layer that may be the same or different from the first metal layer, wherein said first metal layer and said second metal layer do not include a Si-containing gate electrode thereon.

In addition to providing a semiconductor structure, the present invention provides a method for fabricating the inventive semiconductor structure. In general terms, the method of the present invention comprises:

providing a semiconductor substrate comprising at least one nFET device region and at least one pFET device region, which are separated by an isolation region;

forming a first metal gate stack within said at least one nFET device region, said first metal gate stack having nFET behavior and comprising a rare earth metal-containing layer and a first metal layer; and forming a second metal gate stack within said at least one pFET device region, said second metal gate stack having pFET behavior and comprising a second metal layer that may be the same or different from the first metal layer, wherein said first metal layer and said second metal layer do not include a Si-containing gate electrode thereon.

BRIEF DESCRIPTION OF THE DRAWINGS

FIGS. 1A-1F are pictorial representations (through cross sectional views) depicting one embodiment of the present invention for fabricating the inventive structure.

FIGS. 2A-2C are pictorial representations (through cross sectional views) depicting another embodiment of the present invention for fabricating the inventive structure.

DETAILED DESCRIPTION OF THE INVENTION

Figure 1A:
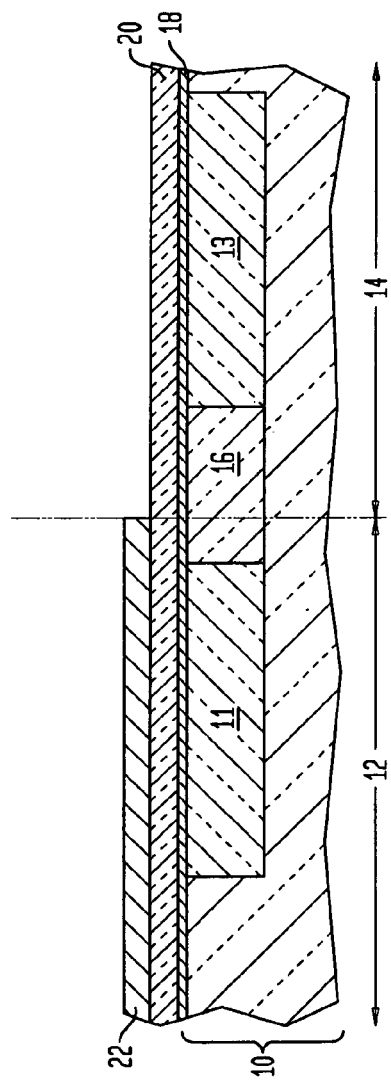

The present invention, which provides a semiconductor structure and a method of fabricating the same, will now be described in greater detail by referring to the drawings that accompany the present application. It is noted that the drawings of the present application are provided for illustrative purposes and, as such, they are not drawn to scale. It is also noted that in the drawings, like and/or corresponding elements are referred to by like reference numerals.

It is further observed that the drawings of the present application show a fragment of a semiconductor substrate including a single nFET device region and a single pFET device region. Although such an embodiment is specifically shown and described, the present invention is not limited to a single region for the pFET devices and the nFET devices, but instead contemplates a plurality of each of such device regions located throughout the remaining portions of the substrate. Also, more that one nFET device and pFET device can be formed in the corresponding device region.

Reference is first made to FIGS. 1A-1F which illustrate the basic processing flow utilized in a first embodiment of the present invention. In the first embodiment of the present invention, a single metal layer, without an overlying Si-containing gate electrode, is used as the gate in both the nFET device and the pFET device. In order to maintain nFET behavior, a rare earth metal (or rare earth-like)-containing layer is present below the single metal layer in the nFET device region. In both cases, a dielectric material having a dielectric constant of greater than that of silicon dioxide is present beneath the single metal gate.

FIG. 1A shows an initial structure that is used in this embodiment of the present invention. The initial structure shown in FIG. 1A includes a semiconductor substrate 10 comprising at least one nFET device region 12 (i.e., an area of the substrate 10 in which nFETs will be subsequently formed) and at least one pFET device region 14 (i.e., an area of the substrate 10 in which pFETs will be subsequently formed). In accordance with the present invention, the at least one nFET device region 12 is separated (in the lateral direction) by an isolation region 16. The initial structure also shows the presence of a p-well region 11 within the at least one nFET device region 12, and an n-well region 13 within the at least one pFET device region 14. The well regions 11 and 13, respectively, are optional and need not be present in all instances. FIG. 1A also shows the presence of an optional interfacial layer 18, and a dielectric material 20 having a dielectric constant of greater than that of silicon dioxide present on the substrate in both device regions. A rare earth metal (or a rare earth-like) containing layer 22 is present on the dielectric material 20 within the nFET device region 12.

The semiconductor substrate 10 of the initial structure shown in FIG. 1A comprises any semiconducting material including, but not limited to: Si, Ge, SiGe, SiC, SiGeC, GaAs, GaN, INAs, InP and all other III/V or II/VI compound semiconductors. Semiconductor substrate 10 may also comprise an organic semiconductor or a layered semiconductor such as Si/SiGe, or a semiconductor-on-insulator (SOI). In some embodiments of the present invention, it is preferred that the semiconductor substrate 10 be composed of a Si-containing semiconductor material, i.e., a semiconductor material that includes silicon. The semiconductor substrate 10 may be doped, undoped or contain doped and undoped regions therein. The semiconductor substrate 10 may include a single crystal orientation or it may include at least two coplanar surface regions that have different crystal orientations (the latter substrate is referred to in the art as a hybrid substrate). When a hybrid substrate is employed, an nFET is typically formed on a (100) crystal surface, while a pFET is typically formed on a (110) crystal plane. The hybrid substrate can be formed by techniques such as described, for example, in U.S. Ser. No. 10/250,241, filed Jun. 17, 2003, now U.S. Publication No. 20040256700A1, U.S. Ser. No. 10/725,850, filed Dec. 2, 2003, and U.S. Ser. No. 10/696,634, filed Oct. 29, 2003, the entire contents of each are incorporated herein by reference.

The well regions 11 and 13 are doped regions that are formed into the semiconductor substrate 10 utilizing conventional ion implantation processes. It is again noted that the well regions are optional and need not be present in all instances.

At least one isolation region 16 is then typically formed into the semiconductor substrate 10. The isolation region 16 may be a trench isolation region or a field oxide isolation region. The trench isolation region is formed utilizing a conventional trench isolation process well known to those skilled in the art. For example, lithography, etching and filling of the trench with a trench dielectric may be used in forming the trench isolation region. Optionally, a liner may be formed in the trench prior to trench fill, a densification step may be performed after the trench fill and a planarization process may follow the trench fill as well. The depth of the trench used in forming the trench isolation region may vary and is not critical to the present invention. The field oxide may be formed utilizing a so-called local oxidation of silicon process. Note that the at least one isolation region 16 provides isolation between neighboring gate regions, typically required when the neighboring gates have opposite conductivities, i.e., nFETs and pFETs. The neighboring gate regions can have the same conductivity (i.e., both n- or p-type), or alternatively they can have different conductivities (i.e., one n-type and the other p-type). The later case is shown in the drawings of the present application.

After processing the semiconductor substrate 10, an interfacial layer 18 is optionally formed on the surface of the semiconductor substrate 10 by chemical oxidation. The optional interfacial layer 18 is formed utilizing a conventional wet chemical process technique that is well known to those skilled in the art. Alternatively, the interfacial layer 18 may be formed by thermal oxidation or oxynitridation. When the substrate 10 is a Si-containing semiconductor, the interfacial layer 18 is comprised of chemical oxide grown by wet processing, or thermally grown silicon oxide, silicon oxynitride or a nitrided silicon oxide. When the substrate 10 is other than a Si-containing semiconductor, the interfacial layer 18 may comprise a semiconducting oxide, a semiconducting oxynitride or a nitrided semiconducting oxide.

The thickness of the interfacial layer 18 is typically from about 0.5 to about 1.2 nm, with a thickness from about 0.8 to about 1 nm being more typical. The thickness, however, may be different after processing at higher temperatures, which are usually required during CMOS fabrication.

In accordance with an embodiment of the present invention, the interfacial layer 18 is a silicon oxide layer having a thickness from about 0.6 to about 0.8 nm that is formed by wet chemical oxidation. The process step for this wet chemical oxidation includes treating a cleaned semiconductor surface (such as a HF-last semiconductor surface) with a mixture of ammonium hydroxide, hydrogen peroxide and water (in a 1:1:5 ratio) at 65° C. Alternatively, the interfacial layer 18 can also be formed by treating the HF-last semiconductor surface in ozonated aqueous solutions, with the ozone concentration usually varying from, but not limited to: 2 parts per million (ppm) to 40 ppm.

Next, the dielectric material 20 is formed on the surface of the interfacial layer 18, if present, or the surface of the semiconductor substrate 10 by a deposition process such as, for example, chemical vapor deposition (CVD), plasma-assisted CVD, physical vapor deposition (PVD), metalorganic chemical vapor deposition (MOCVD), atomic layer deposition (ALD), evaporation, reactive sputtering, chemical solution deposition and other like deposition processes. Combinations of these processes are also contemplated herein. It is noted that in this step of the present invention, the dielectric material 20 is formed in both the device regions.

The dielectric material 20 employed in the present invention is any dielectric material having a dielectric constant of greater than about 4.0, typically greater than about 7.0. Note that silicon dioxide has a dielectric constant of 4.0 and, as such, the present invention contemplates any dielectric whose dielectric constant is greater than that of silicon dioxide. The dielectric material 20 is typically a metal oxide or mixed metal oxide. Illustrative examples of such dielectrics include, but are not limited: $TiO_2$, $Al_2O_3$, $LaO_2$, $SrTiO_3$, $LaAlO_3$, $ZrO_2$, $Y_2O_3$, $Gd_2O_3$, Hf-based dielectrics (to be described in greater detail herein below), and combinations including multilayers thereof. Preferably, the dielectric material 20 is a Hf-based dielectric.

The term 'Hf-based dielectric' is intended herein to include any high k dielectric containing hafnium, Hf. Examples of such Hf-based dielectrics comprise hafnium oxide ($HfO_2$), hafnium silicate ($HfSiO_x$), Hf silicon oxynitride (HfSiON) or multilayers thereof. In some embodiments, the Hf-based dielectric comprises a mixture of $HfO_2$ and $ZrO_2$ or rare earth oxide such as $La_2O_3$. Typically, the Hf-based dielectric is hafnium oxide or hafnium silicate. Hf-based dielectrics typically have a dielectric constant that is greater than about 10.0.

The physical thickness of the dielectric material 20 may vary, but typically, the dielectric material 20 has a thickness from about 0.5 to about 10 nm, with a thickness from about 1 to about 3 nm being more typical.

In one embodiment of the present invention, the dielectric material 20 is hafnium oxide that is formed by MOCVD were a flow rate of about 70 to about 90 mgm of hafnium-tetrabutoxide (a Hf-precursor) and a flow rate of $O_2$ of about 250 to about 350 sccm are used. The deposition of Hf oxide occurs using a chamber pressure between 0.3 and 0.5 Torr and a substrate temperature of between 400° and 500° C.

In another embodiment of the present invention, the dielectric material 20 is hafnium silicate which is formed by MOCVD using the following conditions (i) a flow rate of the precursor Hf-tetrabutoxide of between 70 and 90 mg/m, a flow rate of $O_2$ between 25 and 100 sccm, and a flow rate of $SiH_4$ of between 20 and 60 sccm; (ii) a chamber pressure between 0.3 and 0.5 Torr, and (iii) a substrate temperature between 400° and 500° C.

After forming the dielectric material 20, a rare earth metal-containing layer 22 is then formed on the dielectric material 20 in both device regions. The rare earth metal-containing layer 22 comprises an oxide or nitride of at least one element from Group IIIB of the Periodic Table of Elements including, for example, La, Ce, Pr, Nd, Pm, Sm, Eu, Ga, Th, Dy, Ho, Er, Tm, Yb, Lu or mixtures thereof. Preferably, the rare earth metal-containing layer 22 comprises an oxide of La, Ce, Y, Sm, Er, and/or Th, with $La_2O_3$ or LaN being most preferred.

The rare earth metal-containing layer 22 is formed utilizing a conventional deposition process including, for example, evaporation, molecular beam deposition, MOCVD, ALD, PVP and other like deposition processes. In one embodiment of the present invention, the rare earth metal-containing layer 22 is formed by placing the structure including the blanket deposited dielectric material 20 into the load-lock of a molecular beam deposition chamber, followed by pumping this chamber down to the range of $10^{-5}$ to $10^{-8}$ Torr. After these steps, the structure is inserted, without breaking vacuum into the growth chamber where the rare earth metal-containing layer 22 such as La oxide is deposited by directing atomic/molecular beams of the rare earth metal and oxygen or nitrogen onto the structure's surface. Specifically, because of the low pressure of the chamber, the released atomic/molecular species are beamlike and are not scattered prior to arriving at the structure. A substrate temperature of about 300° C. is used. In the case of $La_2O_3$ deposition, the La evaporation cell is held in the temperature range of 1400° to 1700° C., and a flow rate of 1 to 3 sccm of molecular oxygen is used. Alternatively, atomic or excited oxygen may be used as well, and this can be created by passing the oxygen through a radio frequency source excited in the range of 50 to 600 Watts. During the deposition, the pressure within the chamber can be in the range from $1 \times 10^{-5}$ to $8 \times 10^{-5}$ Torr, and the La oxide growth rate can be in the range from 0.1 to 2 nm per minute, with a range from 0.5 to 1.5 nm being more typical.

The rare earth metal-containing layer 22 typically has a thickness from about 0.1 nm to about 3.0 nm, with a thickness from about 0.3 nm to about 1.6 nm being more typical.

After forming a blanket layer of material 22, a patterned block mask (not shown) is formed on top of the rare earth metal-containing layer 22 within the nFET device region 12 utilizing conventional processes including deposition and lithography that are well known in the art. The patterned block mask within the nFET device region 12 protects the material layers that are located in that region. Next, the exposed rare earth metal-containing layer 22 within the pFET device region 14 is selectively removed from that region utilizing an etching process that is capable of removing that layer, while stopping on the underlying dielectric material 20. One example of an etching process that can be used in selectively removing the exposed rare earth metal-containing layer 22 from within the pFET device region 14 is a chemical etching process. The patterned block mask is typically removed from within the at least one nFET region 12 at this point of the present invention by utilizing a conventional stripping process that is well known in the art.

After forming the structure shown in FIG. 1A, a material stack 24 comprising from top to bottom a metal layer 26, a non-hydrogen containing cap 28 and a Si-containing layer 30 is formed within both device regions.

The metal layer 26 of the material stack 24 comprises a $MO_xN_y$ compound metal wherein M includes at least one metal selected from Group IVB, VB, VIB or VIIB of the Periodic Table of Elements (CAS version). Typically, M is one of Ti, V, Zr, Nb, Mo, Hf, W, Ta or Re, with Ti being most typical. In the above formula, x is from about 5 to about 40 atomic percent, preferably from about 5 to about 35 atomic percent, with 25 atomic percent being most preferred. The variable y is from about 5 to about 40 atomic percent, preferably from about 15 to about 40 atomic percent, with 35 atomic percent being most preferred. A most preferred compound metal thus is $Ti_{0.4}O_{0.25}N_{0.35}$.

The $MO_xN_y$ compound metal is formed by first providing a metal (M) target and an atmosphere that comprises Ar, $N_2$ and oxygen—the oxygen is present within the atmosphere in a concentration that can introduce from about 5 to about 40 atomic percent oxygen into the final film. The $MO_xN_y$ film is sputtered from said metal target in said atmosphere. The sputtering process occurs in a reactor chamber of any conventional sputtering apparatus. The metal target used in the present invention includes any solid source of one of the above-mentioned metals.

The oxygen can be introduced into the sputtering atmosphere utilizing one of the following two methods: (I) If the substrate and the target are positioned closed to each in the reactor chamber, an oxygen leak valve can be used to introduce oxygen into the atmosphere. (II) If the substrate and the target are separated by some distance (greater than 3"), the oxygen can be introduced from the pre-sputtering background pressure which can be from about $1 \times 10^{-4}$ Torr or below. In this case, the metal target grabs the oxygen during the sputtering process.

The flow of Ar and $N_2$ employed in the present invention is from about 1 to about 100 sccm for Ar and from about 1 to about 100 sccm for $N_2$ source. More typically, the flow of Ar is about 20 sccm and the flow of $N_2$ is about 1.4 sccm. The other sputtering conditions such as temperature, gas pressure and time are conventional and are well known to those skilled in the art.

The thickness of the metal layer 26 formed may vary depending on the sputtering conditions used and the type of device to be fabricated. Typically, the metal layer 26 has a thickness, after sputtering, from about 2 to about 200 nm, with a thickness of about 100 nm or less being even more typical. It is noted that metal layer 26 is a gate metal that is present within both the nFET device region 12 and the pFET device region 14.

After forming the metal layer 26, the non-hydrogen containing cap 28 of the material stack 24 such as amorphous silicon or doped amorphous silicon is formed. By "non-hydrogen" it is meant that the cap material does not include hydrogen. It is noted that the presence of the cap 28 prevent the metal oxynitride layer 26 from undergoing a workfunction change. The cap 28 is formed utilizing a conventional deposition process well known in the art. The cap 28 is typically doped utilizing an in-situ deposition process or by deposition, ion implantation and annealing. The thickness, i.e., height, of the cap 28 formed at this point of the present invention may vary depending on the process employed. Typically, the cap 28 has a vertical thickness from about 20 to about 180 nm, with a thickness from about 40 to about 150 nm being more typical.

In some embodiments of the present invention, the cap 28 is replaced with a metal nitride layer. The metal nitride layer includes a metal from Group IVB, VB, VIB or VIIB of the Periodic Table of Elements. By way of example, TiN or TaN are particularly preferred materials. The metal nitride layer is formed utilizing a conventional deposition process. Examples of conventional depositions that can be used in forming the metal nitride layer include CVD, PVD, ALD, sputtering or evaporation. The physical thickness of the metal nitride layer may vary, but typically, the metal nitride layer has a thickness from about 0.5 to about 200 nm, with a thickness from about 5 to about 100 nm being more typical.

A Si-containing layer 30 such as epitaxial silicon, silicon dioxide, and the like is then formed atop the non-hydrogen containing cap 28 (or the metal nitride layer). The Si-containing layer 30 is formed utilizing a conventional deposition process such as, for example, CVD, PECVD, evaporation and the like. The Si-containing layer 30, which serves as a silicon source for forming a subsequent silicide contact atop the FETs, typically has a thickness from about 10 to about 100 nm, with a thickness from about 10 to about 30 nm being even more typical.

The material stack 24 is then patterned by lithography and etching so as to provide a patterned gate region or stack 32 within each of the device regions. Although a single patterned gate region (or stack) 32 is shown in each of the device regions, the present invention contemplates forming a plurality of patterned gate regions (or stacks) 32. When a plurality of patterned gate regions (or stacks) 32 are formed, the gate regions (or stacks) may have the same dimension, i.e., length, or they can have variable dimensions to improve device performance. Each patterned gate stack (or region) 32 at this point of the present invention includes at least a patterned material stack 24. FIG. 1C shows the structure after pattern gate region (or stack) 32 formation. In the illustrated embodiment, the material stack 24 is etched, i.e., patterned, during this step of the present invention.

Figure 1B:
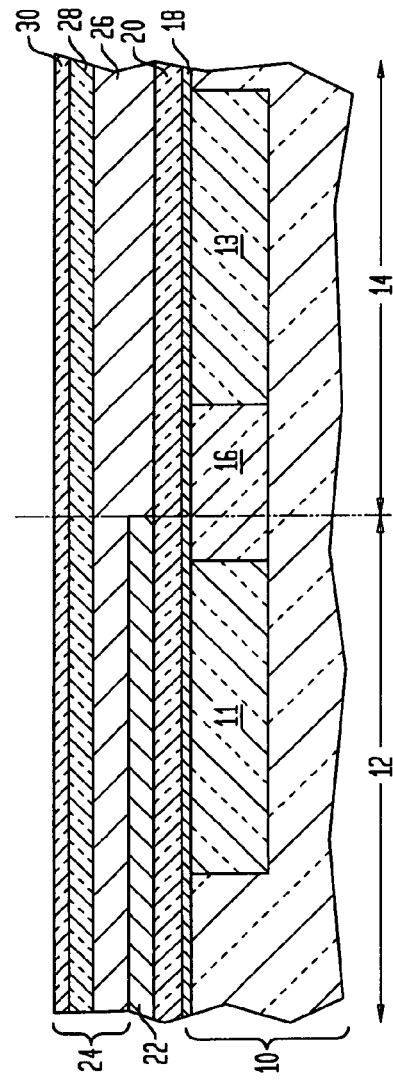

The lithographic step includes applying a photoresist to the upper surface of the blanket layered structure shown in FIG. 1B, exposing the photoresist to a desired pattern of radiation and developing the exposed photoresist utilizing a conventional resist developer. The pattern in the photoresist is then transferred to the structure utilizing one or more dry etching steps. In some embodiments, the patterned photoresist may be removed after the pattern has been transferred into one of the layers of the blanket layered structure. In other embodiments, the patterned photoresist is removed after etching has been completed.

Suitable dry etching processes that can be used in the present invention in forming the patterned gate region (or stack) 32 include, but are not limited to: reactive ion etching, ion beam etching, plasma etching or laser ablation. The dry etching process employed is typically, but not always, selective to the underlying dielectrics therefore this etching step does not typically remove those dielectrics from the structure. In some embodiments (not shown), this etching step may however be used to remove portions of the rare earth metal-containing layer 22, the dielectric material 20 and the interfacial layer 18 that are not protected by the gate region (or stack) 32 that were previously etched.

At this point of the present invention, extension regions 34 are typically formed utilizing a conventional ion implantation process well known to those skilled in the art. The extension regions 34 are shallow, relative to the diffusion regions to be subsequently formed, and an inner edge thereof is aligned to the vertical edge of the gate regions 32. The structure including the extension regions 34 is also shown in FIG. 1C.

Next, and as is shown in FIG. 1D, at least one spacer 36 is typically, but not always, formed on exposed sidewalls of each patterned gate region (or stack) 32. The at least one spacer 36 is comprised of an insulator such as an oxide, nitride, oxynitride and/or any combination thereof. The at least one spacer 36 is formed by deposition and etching.

The width of the at least one spacer 36 must be sufficiently wide such that the source and drain silicide contacts (to be subsequently formed) do not encroach underneath the edges of the gate region (or stack) 32. Typically, the source/drain silicide does not encroach underneath the edges of the gate region (or stack) 32 when the at least one spacer 36 has a width, as measured at the bottom, from about 20 to about 80 nm.

The gate region (or stack) 32 can be optionally passivated prior to spacer formation by subjecting the same to a thermal oxidation, nitridation or oxynitridation process. Passivation should preferably be performed utilizing a non-hydrogen process. The passivation step forms a thin layer of passivating material (not shown) about the gate region (or stack) 32. This step may be used instead or in conjunction with the previous step of spacer formation. When used with the spacer formation step, spacer formation occurs after the gate region (or stack) 32 passivation process. It is noted that both the passivation and spacer formation processes utilized in the present invention are performed utilizing non-hydrogen containing materials.

Source/drain diffusion regions 38 (with or without the spacers present) are then formed into the substrate. The source/drain diffusion regions 38 are formed utilizing ion implantation and an annealing step. The annealing step serves to activate the dopants that were implanted by the previous implant step. The conditions for the ion implantation and annealing are well known to those skilled in the art. The structure formed after ion implantation and annealing is shown in FIG. 1E.

Halo implants (not shown) are also contemplated herein. As is shown, the source/drain extensions 34 are typically shallower than the deep source/drain regions 38 and they include an edge that is aligned with an edge of the patterned gate region (or stack) 20. The source/drain regions 38 include an edge that is typically aligned to the outermost edge of the at least one spacer 36.

Next, and if not previously removed, the exposed portion of the rare earth metal containing layer 22 is removed from within the nFET device region 12. See FIG. 1F. The exposed portions of layer 22 within the nFET device region are removed utilizing an etching process that selectively removes rare earth metal (or rare earth metal-like) materials. An example of such as etching process is a chemical wet etching process.

FIG. 1F also shows the structure after removing the exposed portions of both the dielectric material 20 and the interfacial layer 18 from both device regions. In accordance with the present invention, these materials are removed utilizing a chemical etching process that selectively removes these insulating materials. This etching step stops on an upper surface of the semiconductor substrate 10. Although any chemical etchant may be used in removing the exposed portions of the high k dielectric 20 and the underlying interfacial layer 18, in one embodiment dilute hydrofluoric acid (DHF) is used.

FIG. 1F further shows the presence of silicide regions 40 atop the source/drain diffusion regions 38 and the cap 28 (note that layer 30 gets consumed during the silicide process). The silicide regions 40 are formed utilizing any conventional silicidation process. In some embodiments and when no Si-containing material is present on at least the source/drain regions 38, a Si-containing material, such as epitaxial Si can be formed prior to silicidation.

The silicidation process comprises forming a conductive and refractory metal such as Co, Ti, W, Ni, Pt or alloys thereof with other alloying additives, such as C, Ge, Si, and etc., on top of the area to be silicided. A conventional deposition process, such as CVD, PECVD, sputtering, evaporation or plating, can be used. Optionally, a barrier layer may be formed over the metal layer that protects the metal from oxidation. Examples of optional barrier layers include, for example, SiN, TiN, TaN, TiON and combinations thereof. Following metal deposition the structure is subjected to at least a first anneal that causes reaction between the deposited metal and Si and subsequent formation of a metal silicide. The annealing is typically performed at a temperature from about 250° to about 800° C., with a first annealing temperature from about 400° to about 550° C. being more typical.

In some embodiments, the first anneal forms a metal rich silicide phase, which is highly resistant to a selective etch process. When a metal rich phase is produced, a second higher temperature anneal is required to form a low resistivity silicide. In other embodiments, the first anneal is sufficient in forming the low resistivity silicide.

Following the first anneal, the unreacted and remaining portions of the deposited metal are removed using a conventional etch process, such as wet etching, reactive-ion etching (RIE), ion beam etching, or plasma etching.

If needed, a second anneal is performed after the etching process. The second annealing is typically performed at higher temperatures than the first annealing. A typical temperature range for the second, optional, anneal is from about 550° to about 900° C.

Further CMOS processing such as the formation of BEOL (back-end-of-the-line) interconnect levels with metal interconnects can be formed utilizing processing steps that are well known to those skilled in the art.

Figure 2C:
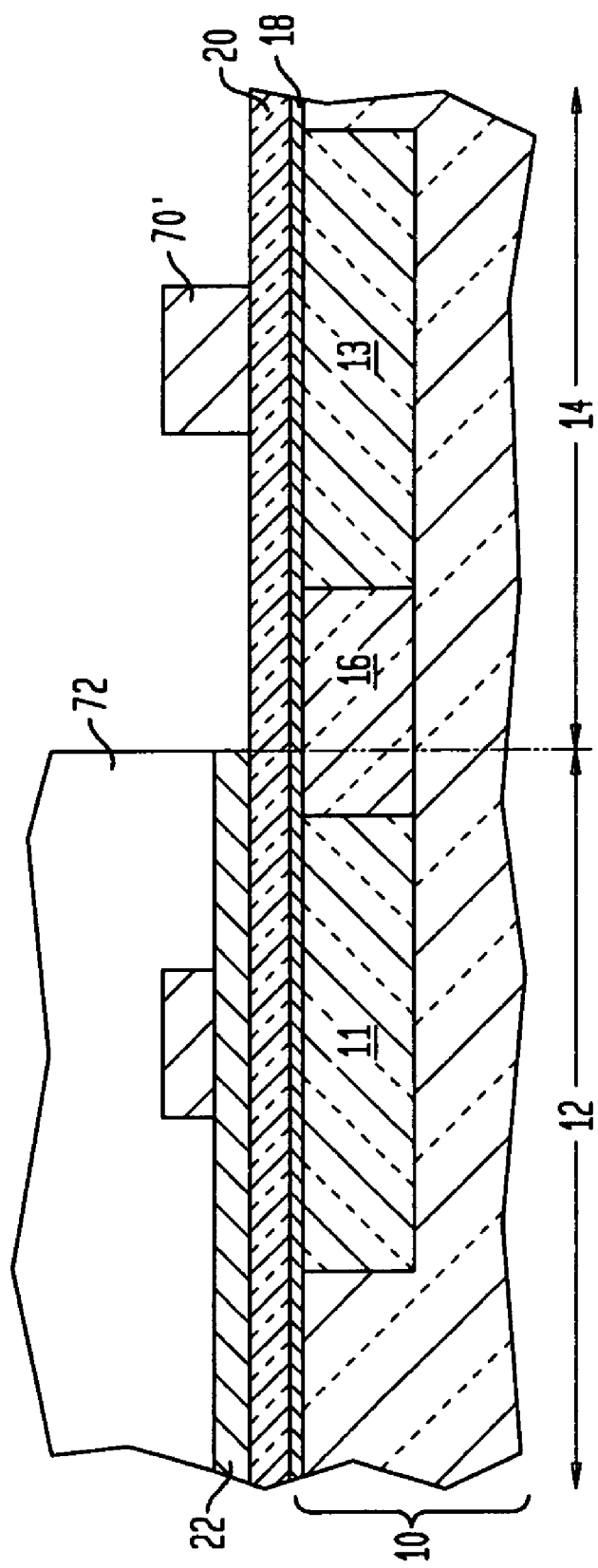

Reference is now made to FIGS. 2A-2C which are cross sectional views depicting another embodiment of the present invention for fabricating the inventive structure. In this embodiment of the present invention, the material stack 24 described above is not employed. Instead, a metal nitride layer is formed within both device regions, patterned, and then a patterned block mask is formed within the nFET device region 12. The patterned gate region within the pFET device region 14 is then oxidized forming a $M'O_aN_b$ layer in the pFET device region 14. The block mask is removed, extension regions are formed and the processing as described in FIGS. 1D-1F is performed. Specifically, the second embodiment begins by providing the structure shown in FIG. 2A. It is noted that the structure shown in FIG. 2A is essentially the same as shown in FIG. 1A. Thus, the above materials and processing used in forming FIG. 1A structure are also applicable here for FIG. 2A structure.

FIG. 2B shows the structure of FIG. 2A after forming a metal nitride layer 70 thereon. Metal nitride layer 70 includes a metal from Group IVB, VB, VIB or VIIB of the Periodic Table of Elements. Hence, the metal nitride layer 70 may include Ti, Zr, Hf, V, Nb, W or Ta, with Ti or Ta being highly preferred. By way of example, TiN or TaN are particularly preferred materials. The metal nitride layer 70 is formed utilizing a conventional deposition process. Examples of conventional depositions that can be used in forming the metal nitride layer 70 include CVD, PVD, ALD, sputtering or evaporation.

The physical thickness of the metal nitride layer 70 may vary, but typically, the metal nitride layer 70 has a thickness from about 0.5 to about 200 nm, with a thickness from about 5 to about 100 nm being more typical.

In one embodiment of the present invention, the metal nitride layer 70 is TiN that is deposited by evaporating Ti from an effusion cell held in the range of 1550° to 1900° C., typically 1600° to 1750° C., and using an atomic/excited beam of nitrogen that is passed through a remote radio frequency source. The substrate temperature can be around 300° C. and the nitrogen flow rate can be between 0.5 sccm and 3.0 sccm. These ranges are exemplary and by no way limit the present invention. The nitrogen flow rate depends upon the specifics of the deposition chamber, in particularly, the pumping rate on the chamber. The TiN may be deposited, in other ways, as well, such as chemical vapor deposition or sputtering and the technique is not critical.

After forming the metal nitride layer 70 within both device regions, the structure shown in FIG. 2B is patterned by lithography and etching providing a gate stack including a patterned metal nitride layer 70 within each of the device regions. A block mask 72 comprising a conventional material is then formed within the nFET device region 12 so as to protect the materials layers within the nFET device region 12. The block mask 72 is formed by deposition and lithography. Etching may optionally be used in forming the block mask 72. FIG. 2C shows the structure in which block mask 72 is present within the nFET device region 12. Next, and as also shown in FIG. 2C, the exposed patterned metal nitride layer 70 within the pFET device region 14 is subjected to an oxidation process which introduces oxygen within the patterned nitride layer forming a $M'O_aN_b$ layer 70' in the pFET device region 14, wherein M' is a metal from Group IVB, VB, VIB or VIIB of the Periodic Table of Elements, a is from about 5 to about 40 atomic percent and b is from about 5 to about 40 atomic percent. Preferably, M' is one of Ti, Zr, Hf, V, Nb, W or Ta, with Ti or Ta, with Ti or Ta being more highly preferred. Preferably, a is from about 5 to about 35 atomic percent and b is from about 15 to about 40 atomic percent. More preferably, a is 25 atomic percent and b is 35 atomic percent.

The oxidation used at this point of the present invention is performed in any oxygen-containing ambient such as, for example, $O_2$, ozone or NO, that is admixed with an inert gas such as, for example, He, Ar, $N_2$ and the like. The oxidation is performed at a temperature from about 300° to about 800° C.

The oxygen can also be introduced by selectively implanting oxygen atoms in the metal nitride layer within the pFET device region 14 and then subjecting the same to an annealing step that is performed at a temperature from about 300° to about 800° C. The concentration of oxygen ions being implant is sufficient to provide the above-mentioned values from a and b. Gas phase doping may also be used to introduce oxygen with the gate stack of the pFET device region 14.

The patterned block mask 72 is removed from within the nFET device region 12 utilizing a conventional stripping process.

After forming extension regions (not shown) within the substrate 10, the procedure as outlined above in FIGS. 1D-1F is then performed in providing a final structure in accordance with the present invention.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A method of fabricating a semiconductor structure comprising:
   providing a semiconductor substrate comprising at least one nFET device region and at least one pFET device region, which are separated by an isolation region;
   forming a first metal gate stack within said at least one nFET device region, said first metal gate stack having nFET behavior and comprising a rare earth metal-containing layer and a first metal layer located on said rare-earth metal-containing layer, wherein said first metal layer is the sole metal gate layer within the nFET device region and said rare-earth metal-containing layer having outer vertical edges that extend beyond outer vertical edges of said first metal layer; and
   forming a second metal gate stack within said at least one pFET device region, said second metal gate stack having pFET behavior and comprising a second metal layer that may be the same or different from the first metal layer, wherein said first metal layer and said second metal layer do not include a Si-containing gate electrode thereon and said second metal layer is the sole metal gate layer within the pFET device region.

2. The method of claim 1 wherein said first metal layer and the second metal layer are the same and comprise a $MO_xN_y$ compound metal wherein M includes at least one metal selected from Group IVB, VB, VIB or VIID of the Periodic Table of Elements, x is from about 5 to about 40 atomic percent and y is from about 5 to about 40 atomic percent.

3. The method of claim 2 wherein said compound metal is formed by sputtering using a metal target and an atmosphere comprising Ar,$N_2$ and oxygen.

4. The method of claim 3 wherein said oxygen is from a pre-sputtering background pressure.

5. The method of claim 2 wherein said rare earth metal-containing layer comprises an oxide or a nitride of at least one element from Group IIIB of the Periodic Table of Elements that is formed by deposition.

6. The method of claim 2 wherein said first metal layer and the second metal layer are different, said first metal layer comprising a metal nitride including a metal from Group IVB, VB, VIB or VIIB of the Periodic Table of Elements, and said second metal layer comprising a $M'O_aN_b$, wherein M' is a metal from Group IVB,VB, VIB or VIIB of the Periodic Table of Elements, a is from about 5 to about 40 atomic percent and b is from about 5 to about 40 atomic percent.

7. The method of claim 6 wherein said $M'O_aN_b$ material is formed introducing oxygen into a metal nitride layer.

8. The method of claim 7 wherein said oxygen is introduced by oxidation, or by ion implantation and annealing, or by gas phase doping.

9. The method of claim 2 further comprising forming a dielectric material beneath said first and second gate stacks, said dielectric material has a dielectric constant that is greater than of silicon dioxide.

10. The method of claim 9 wherein said dielectric material comprises a Hf-based dielectric.

* * * * *